United States Patent
Shimizu et al.

(10) Patent No.: US 9,620,446 B2
(45) Date of Patent: Apr. 11, 2017

(54) WIRING BOARD, ELECTRONIC COMPONENT DEVICE, AND METHOD FOR MANUFACTURING THOSE

(71) Applicant: SHINKO ELECTRIC INDUSTRIES CO., LTD., Nagano-shi, Nagano (JP)

(72) Inventors: Noriyoshi Shimizu, Nagano (JP); Hiromu Arisaka, Nagano (JP); Akio Rokugawa, Nagano (JP); Toshinori Koyama, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/962,527

(22) Filed: Dec. 8, 2015

(65) Prior Publication Data
US 2016/0174379 A1 Jun. 16, 2016

(30) Foreign Application Priority Data

Dec. 10, 2014 (JP) ................... 2014-250019
Feb. 4, 2015 (JP) ................... 2015-019885

(51) Int. Cl.
| | |
|---|---|
| H05K 7/10 | (2006.01) |
| H01L 23/498 | (2006.01) |
| H01L 23/31 | (2006.01) |
| H05K 1/11 | (2006.01) |
| H05K 1/18 | (2006.01) |

(Continued)

(52) U.S. Cl.
CPC .... *H01L 23/49822* (2013.01); *H01L 23/3157* (2013.01); *H01L 23/49811* (2013.01); *H01L 23/49816* (2013.01); *H01L 23/49827* (2013.01); *H01L 23/49894* (2013.01); *H01L 23/544* (2013.01); *H05K 1/11* (2013.01); *H05K 1/115* (2013.01); *H05K 1/181* (2013.01); *H01L 23/562* (2013.01); *H01L 2223/5442* (2013.01); *H01L 2223/54426* (2013.01); *H01L 2223/54486* (2013.01); *H01L 2224/16225* (2013.01); *H01L 2924/0002* (2013.01);

(Continued)

(58) Field of Classification Search
CPC .......... H05K 1/181; H05K 1/115; H05K 1/11; H05K 2201/2081
USPC ...................................... 361/767
See application file for complete search history.

(56) References Cited

U.S. PATENT DOCUMENTS

| | | | |
|---|---|---|---|
| 7,371,976 B2* | 5/2008 | Wakihara | H05K 1/0269 174/262 |
| 2008/0202803 A1* | 8/2008 | Nagase | H01L 23/3121 174/262 |

(Continued)

FOREIGN PATENT DOCUMENTS

JP 2001-110836 4/2001

OTHER PUBLICATIONS

Co-pending U.S. Appl. No. 14/962,536, which was filed in the United States Patent and Trademark Office on Dec. 8, 2015.

*Primary Examiner* — Hoa C Nguyen
(74) *Attorney, Agent, or Firm* — Rankin, Hill & Clark LLP

(57) ABSTRACT

A wiring board includes plural terminals, an insulating layer, and recess portions. Each terminal includes a roughened upper surface and a roughened side surface. The insulating layer is formed between the terminals. The upper surfaces of the terminals are exposed. An upper surface of the insulating layer is a concave curved surface. The recess portions are (Continued)

formed in the insulating layer around the terminals so as to partially expose the side surfaces of the terminals.

9 Claims, 18 Drawing Sheets

(51) Int. Cl.
  *H01L 23/544* (2006.01)
  *H01L 23/00* (2006.01)
(52) U.S. Cl.
  CPC ............... *H01L 2924/15174* (2013.01); *H01L 2924/15311* (2013.01); *H05K 2201/2081* (2013.01)

(56) References Cited

U.S. PATENT DOCUMENTS

| | | | | |
|---|---|---|---|---|
| 2012/0005888 | A1* | 1/2012 | Nakai | C25D 5/02 29/829 |
| 2013/0075145 | A1* | 3/2013 | Kaneko | H05K 1/113 174/262 |
| 2013/0098670 | A1* | 4/2013 | Inoue | H05K 3/4007 174/264 |
| 2014/0284081 | A1* | 9/2014 | Nishida | H05K 3/28 174/250 |
| 2015/0008020 | A1* | 1/2015 | Kaneko | H05K 3/465 174/257 |
| 2015/0223332 | A1* | 8/2015 | Nishida | H01L 21/563 174/261 |
| 2015/0313015 | A1* | 10/2015 | Wada | H01L 23/49811 174/261 |
| 2015/0334837 | A1* | 11/2015 | Nishida | H05K 3/28 174/251 |

* cited by examiner

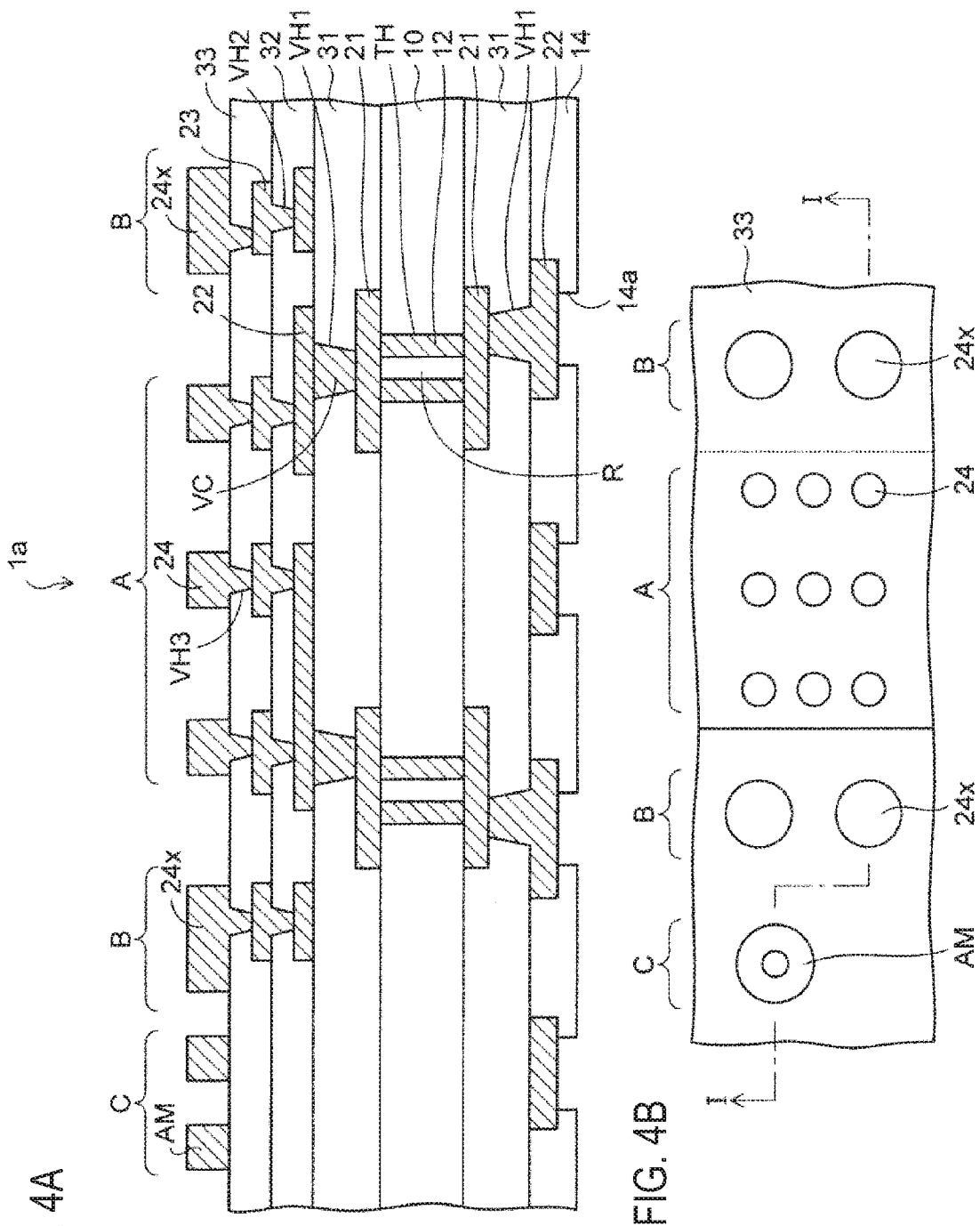

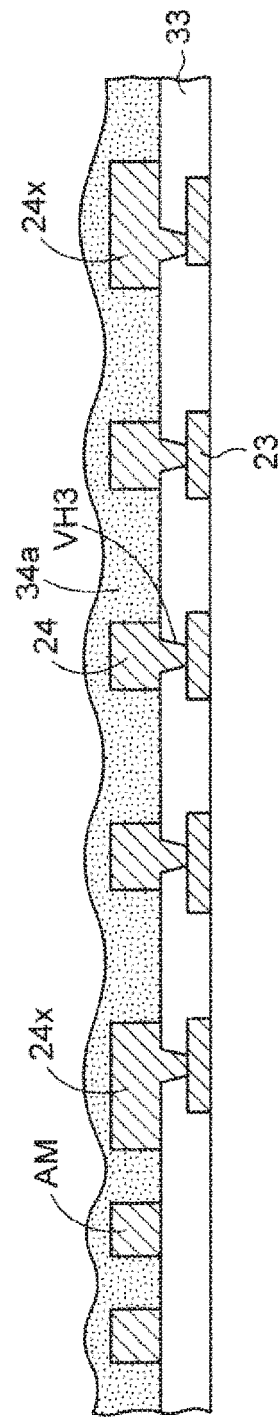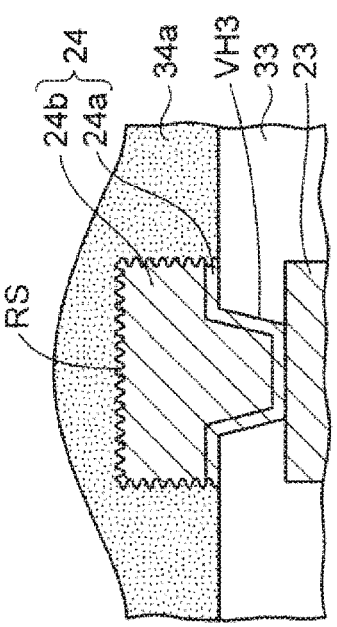
FIG. 8A
FIG. 8B

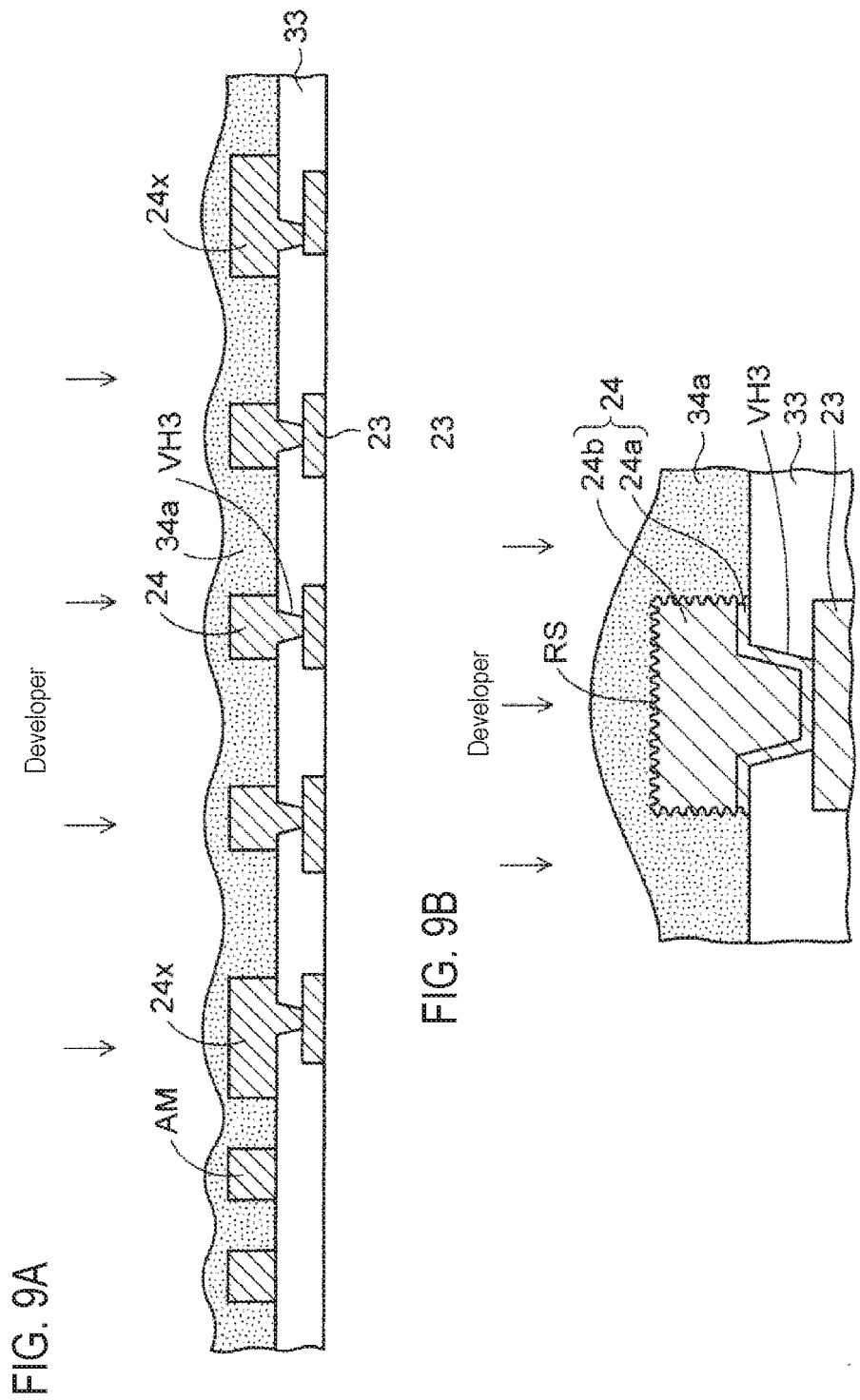

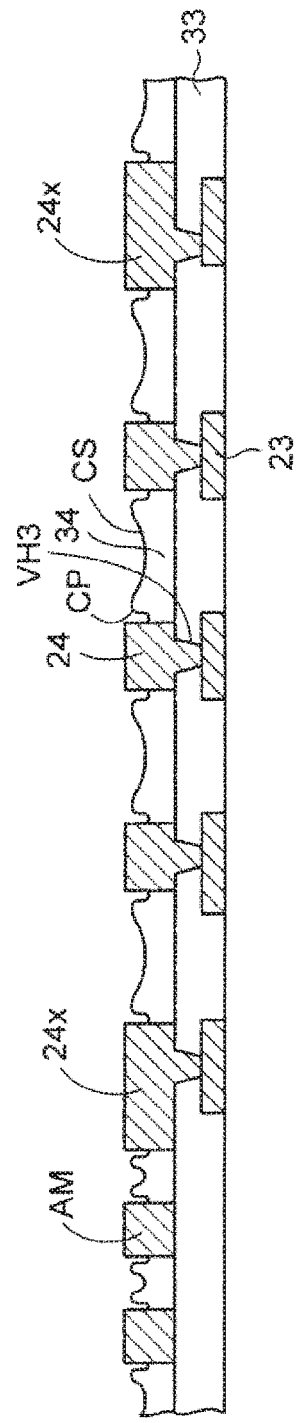
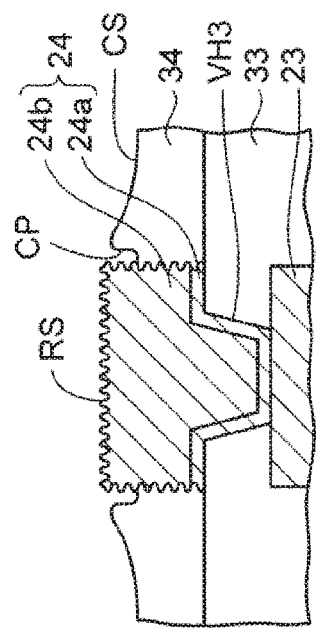
FIG. 11A
FIG. 11B

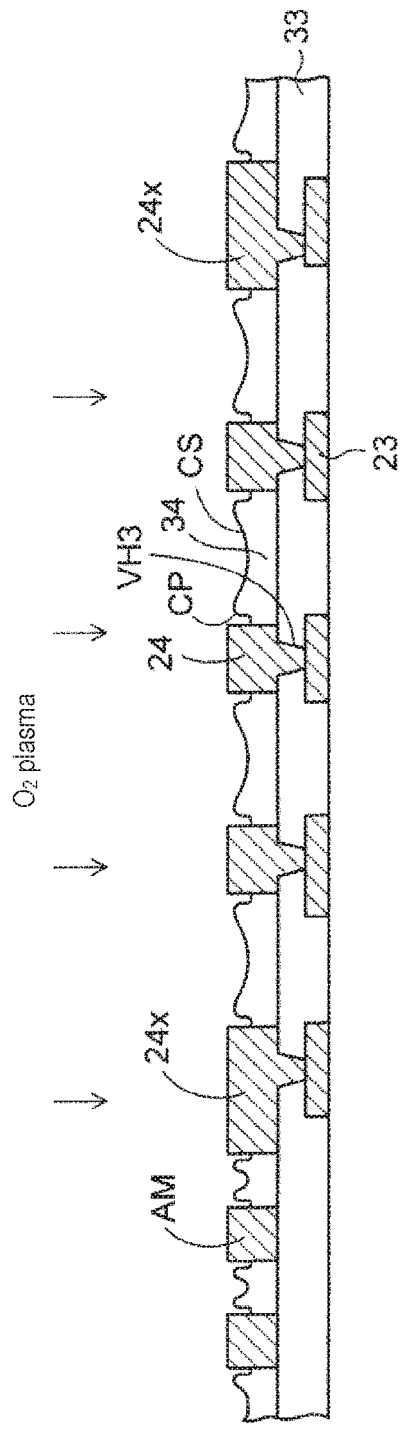
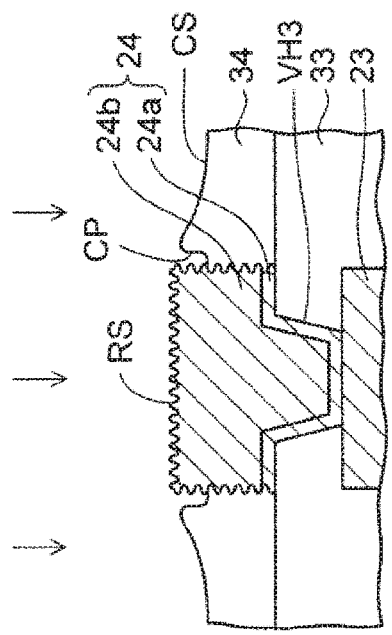
FIG. 13A
FIG. 13B

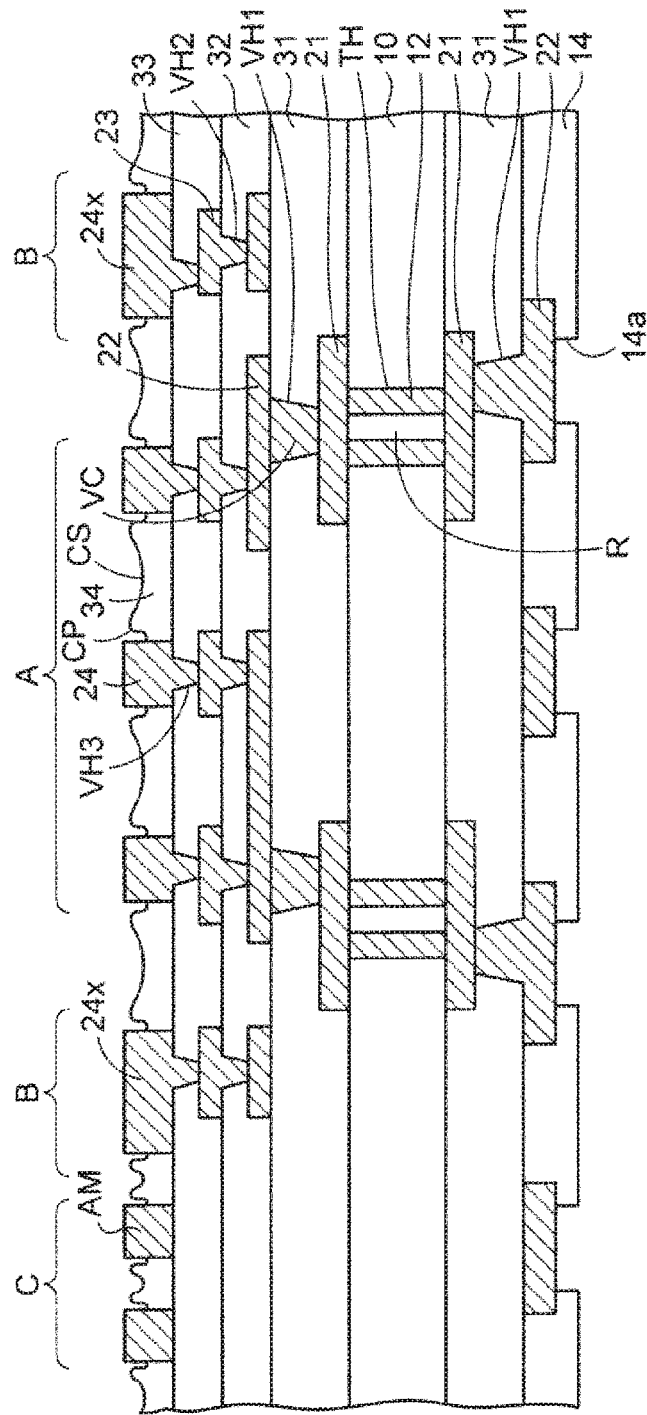
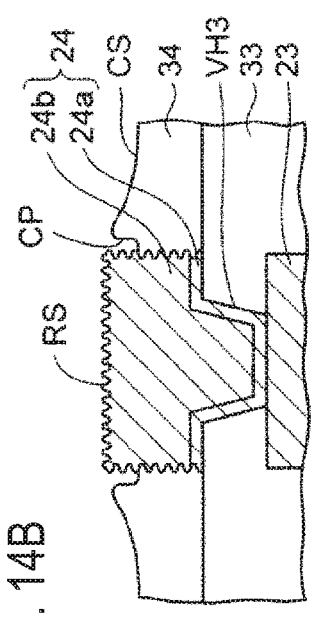
FIG. 14A
FIG. 14B

WIRING BOARD, ELECTRONIC COMPONENT DEVICE, AND METHOD FOR MANUFACTURING THOSE

This application claims priority from Japanese Patent Application Nos. 2014-250019 (filed on Dec. 10, 2014) and 2015-019885 (filed on Feb. 4, 2015), the entire contents of which are herein incorporated by reference.

BACKGROUND

Field

Exemplary embodiments of the invention relate to a wiring board, an electronic component device, and a method for manufacturing those.

Related Art

There has been a wiring board to be mounted with an electronic component such as a semiconductor chip. In one example of such a wiring board, solder bumps of a semiconductor chip are connected in a flip-chip manner to connection terminals exposed from a protection insulating layer.

SUMMARY

In a method for manufacturing a wiring board according to preliminary matters (which will be described later), the whole surface of a photosensitive resin layer which covers plural columnar terminals is removed up to an intermediate position in a thickness direction of the photosensitive resin layer. Thereby, a protection insulating layer can be formed between the plural columnar terminals with the upper surfaces of the columnar terminals being exposed.

When the solder bumps of the semiconductor chip are connected to the columnar terminals of the wiring board configured thus, solder might flow outward and the solder bumps might be electrically short-circuited with each other.

One exemplary embodiment of the invention provides a wiring board and an electronic component device that have a novel structure being capable of preventing solder from flowing out when an electronic component is connected to a wiring board, and provides a method for manufacturing those.

According to one exemplary embodiment, a wiring board includes plural terminals, an insulating layer, and recess portions. Each terminal includes a roughened upper surface and a roughened side surface. The insulating layer is formed between the terminals. The upper surfaces of the terminals are exposed. An upper surface of the insulating layer is a. concave curved surface. The recess portions are formed in the insulating layer around the terminals so as to partially expose the side surfaces of the terminals.

An electronic component device includes a wiring board and an electronic component. The wiring board includes plural terminals, an insulating layer, and recess portions. Each terminal includes a roughened upper surface and a roughened side surface. The insulating layer is formed between the terminals. The upper surfaces of the terminals are exposed. An upper surface of the insulating layer is a concave curved surface. The recess portions are formed in the insulating layer around the terminals so as to partially expose the side surfaces of the terminals. The electronic component is connected to the terminals of the wiring board through solder disposed in the recess portions and on the upper surfaces of the terminals of the wiring board.

With the above described configurations, when an electronic component is connected to the terminals of the wiring board through solder, the recess portions of the insulating layer serve as dams to prevent the solder from flowing out. Thus, occurrence of electric short-circuit can be prevented.

BRIEF DESCRIPTION OF THE DRAWINGS

FIGS. 4A and 4B are a sectional view and a plan view (part 2) showing the method for manufacturing the wiring board according to the exemplary embodiment;

FIGS. 8A and 8B are sectional views (part 6) showing the method for manufacturing the wiring board according to the exemplary embodiment;

FIGS. 9A and 9B are sectional views (part 7) showing the method for manufacturing the wiring board according to the exemplary embodiment;

FIGS. 11A and 11B are sectional views (part 9) showing the method for manufacturing the wiring board according to the exemplary embodiment;

FIG. 12A is a plan view of a terminal and an insulating layer, FIG. 12B is a perspective view of the terminal and the insulating layer, and FIG. 12C is an partial enlarged perspective view of FIG. 12B;

FIGS. 13A and 13B are sectional views (part 10) showing the method for manufacturing the wiring board according to the exemplary embodiment;

FIGS. 14A and 14B are sectional views showing the wiring board according to the exemplary embodiment;

DETAILED DESCRIPTION

Exemplary embodiments will be described below with reference to the accompanying drawings.

Underlying preliminary matters will be explained prior to description of an exemplary embodiment. FIGS. 1A to 2B show a wiring substrate according to the preliminary matters. It should he noted that the preliminary matters are not a known technique but are experiment results achieved by the inventors.

Figure 1A:
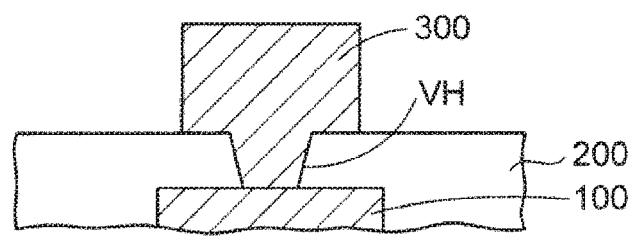
FIGS. 1A and 1B are sectional views (part 1) showing a wiring board according to preliminary matters.

FIG. 1A partially shows the vicinity of a surface of a wiring hoard during manufacture. On the surface side of the wiring board, an insulating layer 200 is formed on a wiring layer 100 as shown in FIG. 1A. A via hole VH is disposed on a connection portion of the wiring layer 100.

Also, a columnar terminal 300 is formed on the insulating layer 200. The columnar terminal 300 is connected to the wiring layer 100 through a via conductor provided in the via hole VH. The columnar terminal 300 is formed as an external connection terminal.

Figure 1B:
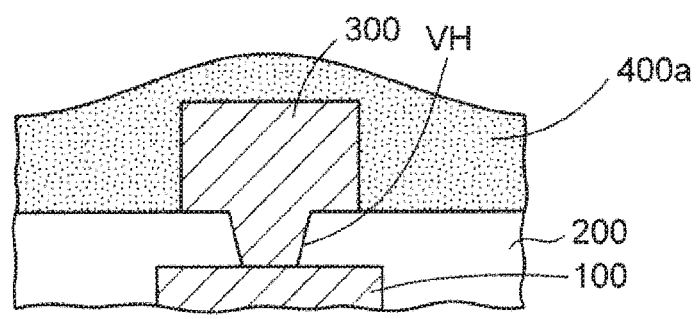
Figure 2A:
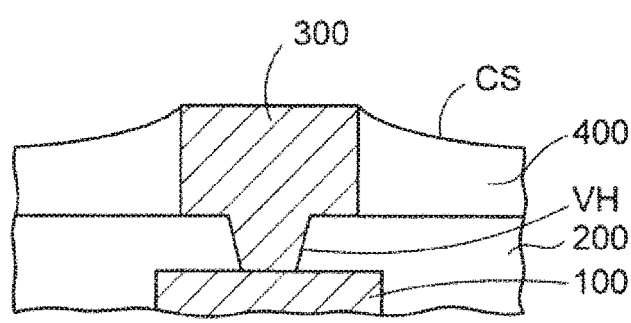
FIGS. 2A and 2B are sectional views (part 2) showing the wiring board according to the preliminary matters.

Next, as shown in FIG. 1B, a liquid photosensitive resin layer 400a is applied onto the insulating layer 200 and the columnar terminal 300. On this occasion, the photosensitive resin layer 400a is formed to rise and fall in accordance with a step of the columnar terminal 300 so that an upper surface of the photosensitive resin layer 400a is (i) at a higher level in a region where the upper surface of the photosensitive resin layer 400a is above the columnar terminal 300 and (ii) at a lower position in a region where the upper surface of the photosensitive resin layer 400a is between the plural columnar terminals 300, Further, as shown in FIG. 2A, the upper side of the photosensitive resin layer 400a is dissolved and removed by a developer so that the upper surface of the columnar terminal 300 is exposed. After that, heating treatment is performed on the photosensitive resin layer 400a. As a result, a protection insulating layer 400 is obtained.

In this manner, the protection insulating layer 400 is formed between the plural columnar terminals 300. On this occasion, the upper surface of the protection insulating layer 400 is formed to he a concave curved surface CS in a region between the columnar terminals 300.

Since the whole upper surfaces of the columnar terminals 300 can be thus exposed, a large contact area can be secured between the columnar terminal 300 and each solder bump of the semiconductor chip. Also, since the upper surfaces of the columnar terminals 300 can be exposed in a self-alignment manner, narrow-pitch columnar terminals 300 can be used.

Figure 2B:
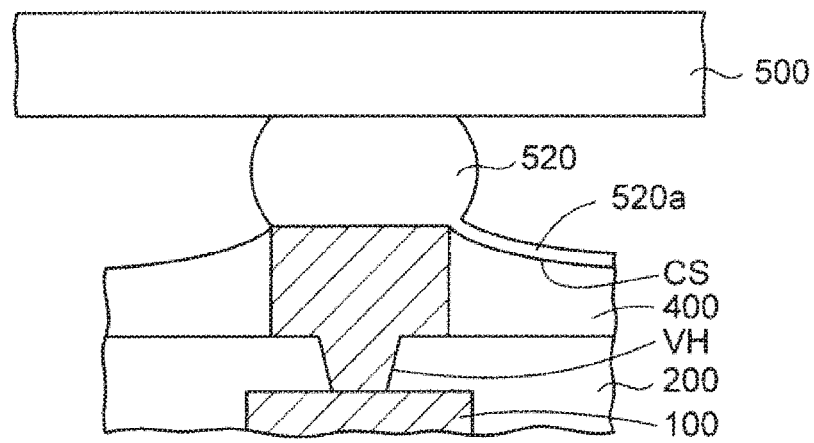

Next, as shown in FIG. 2B, a solder bump 520 of a semiconductor chip 500 is placed on the columnar terminal 300 of the wiring board shown in FIG. 2A, and the solder bump 520 is melted by reflow heating. Thereby, the solder bump 520 of the semiconductor chip 500 is connected to the columnar terminal 300 of the wiring board in a flip-chip manner.

On this occasion, since the upper surface of the protection insulating layer 400 is formed as the concave curved surface CS, a distance between the columnar terminals 300 along the upper surface of the protection insulating layer 400 is longer than that in the case where the upper surface of the protection insulating layer 400 is a flat surface.

In this manner, it is possible to obtain the structure that electric short-circuit may hardly occur between the plural solder bumps 520 even if the solder flows outward when the solder bumps 520 are reflow-heated.

However, as shown in FIG. 2B, electric short-circuit might easily occur between the solder bumps 520 if an amount of solder 520a flowing out increases or if the pitch between the columnar terminals 300 is made narrower. It is, therefore, necessary to provide the structure that the solder 520a can be prevented from flowing out.

A wiring structure according to the exemplary embodiment which will be described below has been made in view of the above circumstances.

Exemplary Embodiments

FIGS. 3 to 13B show a method for manufacturing a wiring board according to the exemplary embodiment. FIGS. 14A and 14B show the wiring board according to the exemplary embodiment. FIGS. 15 to 18 show an electronic component device according to the exemplary embodiment. Description will be given on the structure of the wiring board and the electronic component device while explaining the methods for manufacturing the wiring board and the electronic component device.

Figure 3:
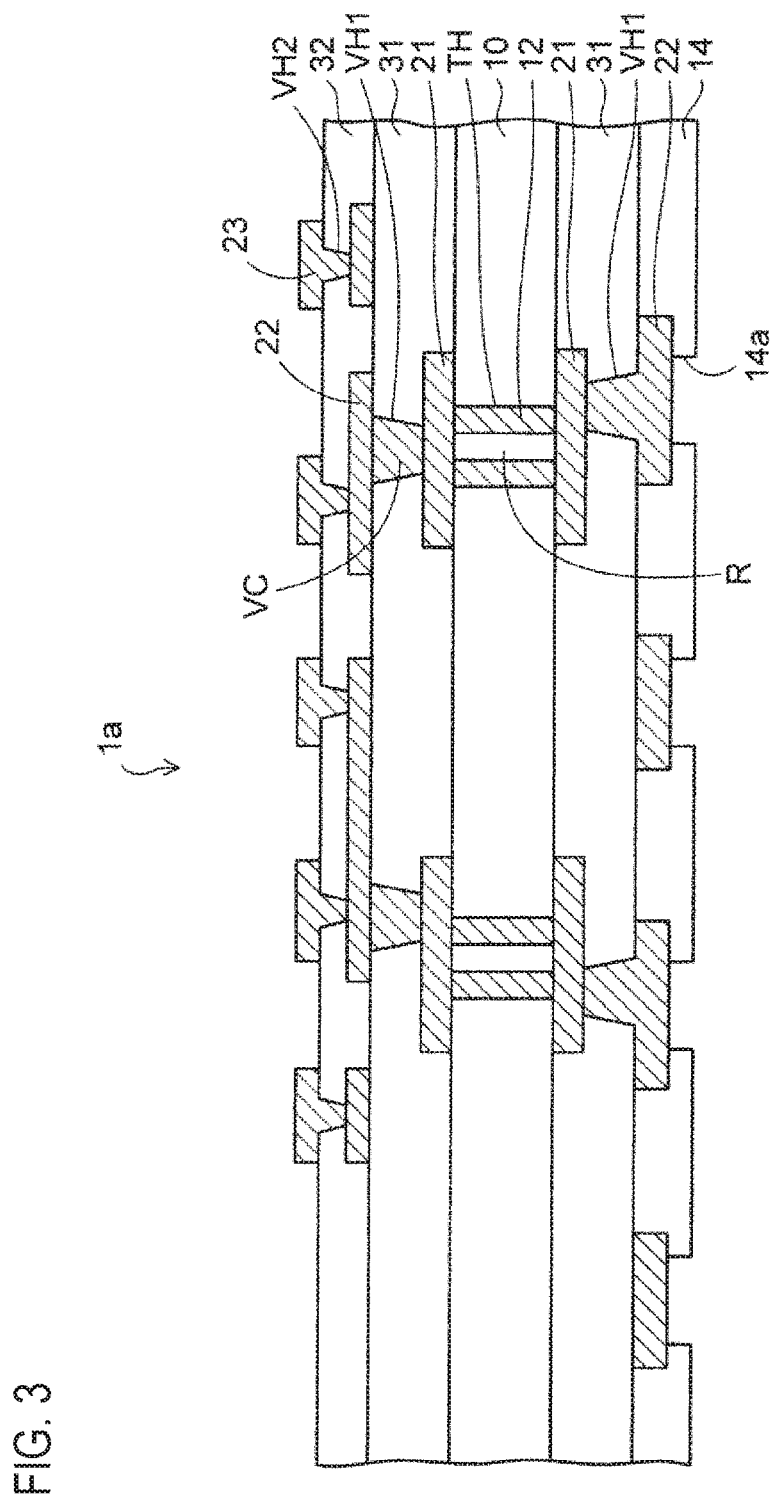
FIG. 3 is a sectional view (part 1) showing a method for manufacturing a wiring board according to an exemplary embodiment.

In the method for manufacturing the wiring board according to the exemplary embodiment, at first, a wiring member 1a shown in FIG. 3 is prepared that is in the middle of a manufacturing process. The wiring member 1a has a core substrate 10 in a center position thereof in a thickness direction. The core substrate 10 is made of glass epoxy resin or the like. The core substrate 10 is, for example, in a range of 0.2 mm to 0.8 mm in thickness.

Through holes TH are formed in the core substrate 10. The through holes TH pass through the core substrate 10 in the thickness direction. A through hole plating layer 12 is formed on a side wall of each through hole TH. The remaining part of the through hole TH is filled with a resin body R.

Also, first wiring layers 21 are formed on the both surface sides of the core substrate 10. Each first wiring layer 21 is, for example, 15 μm to 25 μm in thickness. The first wiring layers 21 on the both surface sides are connected to each other through the through hole plating layer 12.

Alternatively, the whole through holes TH may be filled with a through conductor so that the first wiring layers 21 on the both surface sides are connected to each other through the through conductor.

A first insulating layer 31 is formed on the upper surface side of the core substrate 10. The first insulating layer 31 is formed with first via holes VH1 on connection portions of the first wiring layer 21. The first insulating layer 31 is made of a non-photosensitive resin layer. The first via holes VH1 are formed by laser processing. The first insulating layer 31 is made of epoxy resin, polyimide resin, or the like. The first insulating layer 31 is, for example, in a range of 20 μm to 40 μm in thickness.

Furthermore, each first via hole VH1 is filled with a via conductor VC. The via conductors VC are formed in the following manner. That is, a metal layer (not shown) is formed to fill the first via holes VH1 and to extend to an outside the first via holes VH1. The metal layer may cover a part or the whole of an upper surface of the first insulating layer 31. Then, a portion of the metal layer which is disposed outside the first via holes VH1 is polished by CMP. On this occasion, the surface portion of the first insulating layer 31 is al so polished.

The upper surface of the first insulating layer 31 and the upper surfaces of the via conductors VC are flattened in this manner.

Also, a second wiring layer 22 is formed on the first insulating layer 31. The second wiring layer 22 is connected to the via conductors VC. The upper surface of the first insulating layer 31 is flattened as described above. Therefore, when the wiring layer is formed by a semi-additive method, an accuracy with which a photoresist layer is patterned by photolithography can be improved, The semi-additive method will be described in detail later.

For this reason, the second wiring layer 22 is formed in finer design rules than the first wiring layer 21, The second wiring layer 22 is, for example, about 2 pm in thickness, and the line (width)/space (interval) of the second wiring layer 2 is, for example, 2 μm/2 μm.

Furthermore, a second insulating layer 32 is formed on the first insulating layer 31 on the upper surface side of the core substrate 10. The second insulating layer 32 is formed with second via holes VH2. The second via holes VH2 are disposed on connection portions of the second wiring layer 22. The second insulating layer 32 is made of a photosensitive resin layer. The photosensitive resin layer is patterned by photolithography to form the second via holes VH2. Examples of the photosensitive resin include phenolic resin, polyimide resin, and epoxy resin.

The second insulating layer 32 is formed to be thinner than the first insulating layer 31. The second via holes VH2 are formed in finer design rules than the first via holes VH1. For example, the second insulating layer 32 is in a range of 3 μm to 7 μm in thickness, and preferably 5 μm in thickness. The second via holes VH are about 10 μm in diameter.

Also, a third wiring layer 23 is formed on the second insulating layer 32 on the upper surface side of the core substrate 10. The third wiring layer 23 is connected to the second wiring layer 22 through via conductors provided in the second via holes VH2. The third wiring layer 23 is formed in the fine design rules in the same manner as the second wiring layer 22.

On the other hand, a first insulating layer 31 is formed on the lower surface side of the core substrate 10. The first insulating layer 31 is formed with first via holes VH1. The first via holes VH1 are disposed on connection portions of the first wiring layers 21. A second wiring layer 22 is formed on the first insulating layer 31 on the lower surface side of the core substrate 10. The second wiring layer 22 is connected to the first wiring layer 21 through via conductors in the first via holes VH.

The design rules for the second wiring layer 22 on the lower surface side of the core substrate 10 may be as fine as the design rules for the first wiring layer 21 on the upper surface side of the core substrate 10.

A solder resist layer 14 is formed on the first insulating layer 31 on the lower surface side of the core substrate 10. The solder resist layer 14 is formed with opening portions 14a on connection portions of the second wiring layer 22.

Next, as shown in FIGS. 4A and 4B, a third insulating layer 33 is formed on the second insulating layer 32 on the upper surface side of the core substrate 10 shown in FIG. 3. The third insulating layer 33 is formed with third via holes VH3. The third via holes VH3 are disposed on connection portions of the third wiring layer 23.

In the same manner as the second insulating layer 32, a photosensitive resin layer is patterned to form the third insulating layer 33 and the third via holes VH3. Also, the thickness of the third insulating layer 33 and the diameters of the third via holes VH3 are set to be in fine design rules in the same manner as the second insulating layer 32 and the second via holes VH2.

Next, as shown in the same FIGS. 4A and 4B, columnar terminals 24 are formed on the third insulating layer 33 on the upper surface side of the core substrate 10. The columnar terminals 24 are connected to the third wiring layer 23 through via conductors provided in the third via holes VH3.

The columnar terminals 24 are formed by a semi-additive method. Detailed description will be made with reference to FIGS. 5A to 6B. FIGS. 5A to 6B partially show a region above the third wiring layer 23 on the upper surface side of the core substrate 10 in FIGS. 4A and 4B.

Figure 5A:
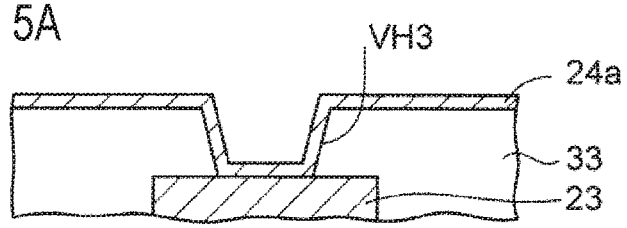
FIGS. 5A to 5C are sectional views (part 3) showing the method for manufacturing the wiring board according to the exemplary embodiment.

As shown in FIG. 5A, at first, a seed layer 24a is formed by a sputtering method on the third insulating layer 33 and on an inner surface of each third via hole VH3 in FIGS. 4A and 4B. A stack film in which a titanium (Ti) layer having 30 nm in thickness and a copper (Cu) layer having 200 nm in thickness are staked in this order from a lower side is used as an example of the seed layer 24a. Alternatively, a stack film made in which a chrome (Cr) layer and a copper (Cu) layer are stacked in this order from the lower side may be used.

Next, a liquid positive type resist (not shown) is applied onto the seed layer 24a by a spin coater Then, exposure and development are performed thereon by photolithography. For example, TMAH (tetramethyl ammonium hydroxide) is used as a developer.

Figure 5B:
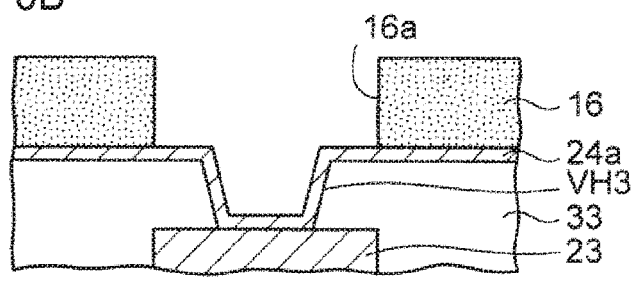

In this manner, a resist layer 16 is formed as shown in FIG. 5B. The resist layer 16 is formed with opening portions 16a at portions where the columnar terminals 24 are to be provided. By use of the positive type resist, the plating resist layer 16 formed with the opening portions 16a in the fine design rules can be formed with high accuracy.

Figure 5C:
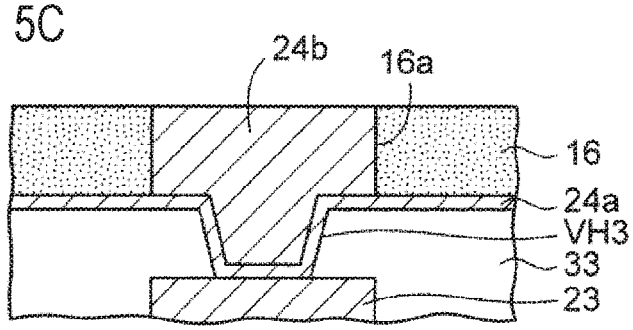
Figure 6A:
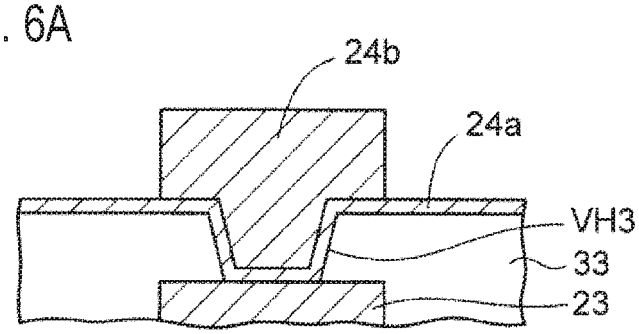
FIGS. 6A and 6B are sectional views (part 4) showing the method for manufacturing the wiring board according to the exemplary embodiment.

Next, as shown in FIG. 5C, a metal plating layer 24b made of copper or the like is formed in each opening portion 16a. of the plating resist layer 16 by electrolytic plating using the seed layer 24a as a plating power feeding passage. Then, as shown in FIG. 6A, the plating resist layer 16 is removed.

Figure 6B:
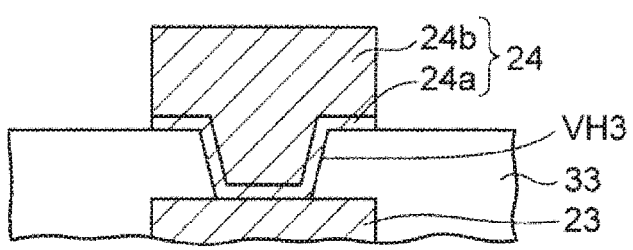

Furthermore, as shown in FIG. 6B, the seed layer 24a is etched and removed using the metal plating layer 24b as a mask.

Where the seed layer 24a is made of a Ti layer/Cu layer, the Cu layer is wet-etched with a mixture of hydrogen peroxide and ammonium sulfate, and the Ti layer is removed by plasma etching using a $CF_4/O_2$-based mixed gas. Alternatively, the Ti layer may be removed with an ammonia-based etchant, In this manner, the columnar terminals 24 including the seed layer 24a and the metal plating layer 24b is formed. The columnar terminals 24 in narrow-pitch design rules can be formed by use of the semi-additive method.

A diameter of each columnar terminal 24 is about 25 μm. An arrangement pitch between the columnar terminals 24 is about 40 μm. Also, a height of each columnar terminal 24 is set to be in a range of 5 μm to 20 μm, for example, 10 μm.

Referring back to FIGS. 4A and 4B, FIG. 4B is a reduced plan view when the sectional view of FIG. 4A is viewed from above. FIG. 4A corresponds to a section taken along a line I-I in the reduced plan view of FIG. 4B.

As shown in FIGS. 4A and 4B, an electronic component mounting region A, an external connection region B, and an alignment region C are defined in the wiring member The columnar terminals 24 are disposed in the electronic component mounting region A. On the other hand, external connection terminals 24x are disposed in the external connection region B. The external connection terminals 24x are at the same height as the columnar terminals 24 alignment marks AM are disposed in the alignment region C. The alignment marks AM are at the same height as the columnar terminals 24. No via holes are disposed under the alignment marks AM. The alignment marks AM are formed on the flat upper surface of the third insulating layer 33.

As shown in FIG. 4B, each alignment mark AM is formed in a doughnut-like shape in which an opening portion is disposed at a center thereof. Alternatively, the alignment mark AM may be formed in another shape such as across shape.

FIGS. 7A to 14B (which will be described later partially show a region above the third wiring layer 23 in FIG. 4A.

Figure 7A:
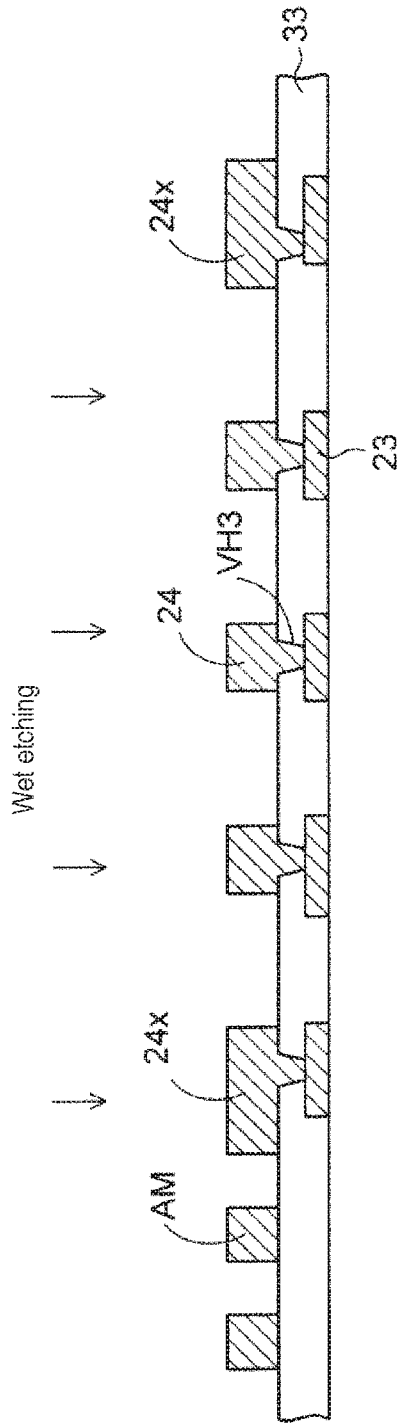
FIGS. 7A and 7B are sectional views (part 5) showing the method for manufacturing the wiring board according to the exemplary embodiment.

As shown in FIG. 7A, the exposed surfaces of the columnar terminals 4 are wet-etched to roughen the upper and side surfaces of the columnar terminals 24. Thus, roughened surfaces RS are formed on the upper and side surfaces of the columnar terminals 24 as shown in a partially enlarged sectional view of FIG. 7B. A surface roughness (Ra) of the roughened surface RS of each columnar terminal 24 is set to be in a range of 0.2 µm to 1.0 µm.

For example, an etchant is sprayed onto the exposed surfaces of the columnar terminals 24 on that the whole upper and side surfaces of the columnar terminals 24 are roughened uniformly. A formic acid based etchant is used as the etchant for the wet etching. An etching amount of each columnar terminal 24 is equal to or less than about 1 µm.

In this manner, the upper and side surfaces of the columnar terminals 24 are formed into the roughened surfaces RS. On this occasion, the upper and side surfaces of the external connection terminals 24x and the alignment marks AM are also formed into the roughened surfaces RS in the same manner.

Next, as shown in FIGS. 8A and 8B, a liquid positive-type photosensitive resin layer 34a is applied onto the third insulating layer 33 by a spin coater so as to cover the columnar terminals 24, the external connection terminals 24x, and the alignment marks AM. Then, the applied liquid positive-type photosensitive resin layer 34a is heated at a temperature of about 100° C.

The upper surface of the photosensitive resin layer 34a is formed to rise and fall in accordance with steps of the patterns of the columnar terminals 24 and the like so that the upper surface of the photosensitive resin layer 34a is (i) at a higher position in a region where the upper surface of the photosensitive resin layer 34a is above the patterns of the columnar terminals 24 and the like and (ii) at a lower position in a region where the upper surface of the photosensitive resin layer 34a is between the patterns of the columnar terminals 24 and the like.

The photosensitive resin layer 34a is set to be thick enough to cover the whole of the patterns of the columnar terminals 24 and the like. Where the columnar terminals 24 are 10 µm in height, a thickness of the photosensitive resin layer 34a is set to be about 10 µm on the third insulating layer 33.

Next, as shown in FIGS. 9A to 10B, the whole surface of the photosensitive resin layer 34a in FIGS. 8A and 8B is dissolved with a developer so that the photosensitive resin layer 34a is removed up to an intermediate position in the thickness direction thereof to expose the upper surfaces of the columnar terminals 24. The photosensitive resin layer 34a which has not been exposed to light is etched with the developer For example, TMAH is used as the developer.

Typically a part of a positive-type photosensitive resin layer which has been exposed to light is dissolved with the developer at a higher rate to thereby form a pattern. On this occasion, a part of the photosensitive resin layer 34a which has not been exposed to light is also dissolved with the developer at a significantly low rate.

In the exemplary embodiment, the removal amount of the photosensitive resin layer 34a is controlled by use of this characteristic. Therefore, the photosensitive resin layer 34a can be left between the columnar terminals 24 while the upper surfaces of the columnar terminals 24 are exposed.

Unlike this exemplary embodiment, if the positive-type photosensitive resin layer 34a whose whole surface has been exposed to light is removed with the developer, the dissolving rate is too high to control the removal amount. Thus, it would be difficult to leave the photosensitive resin layer 34a satisfactorily.

Figure 10A:
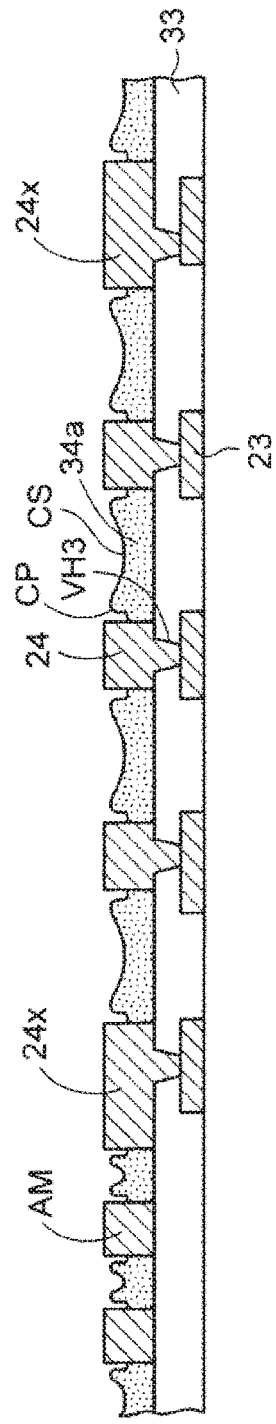
FIGS. 10A and 10B are sectional views (part 8) showing the method for manufacturing the wiring board according to the exemplary embodiment.
Figure 10B:
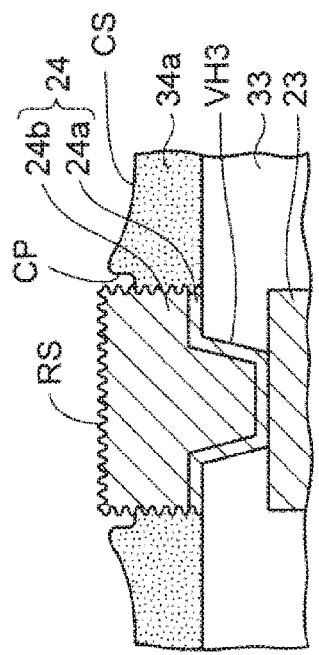

On this occasion, as shown in FIGS. 10A and 10B, the rising and falling upper surface of the photosensitive resin layer 34a in FIGS. 9A and 9B is removed to lower. Thus, the photosensitive resin 34a whose upper surface has been formed into a concave curved surface CS remains between the columnar terminals 24.

Also, on this occasion, referring to the partially enlarged sectional view of FIG. 10B, immediately after the upper surfaces of the columnar terminal 24 are exposed during the removal of the photosensitive resin layer 24a with the developer, a very small part of the photosensitive resin layer 34a which is formed in a concave portion of the roughened surface RS of the side surface of the columnar terminal 24 is dissolved more easily than any other parts.

Thus, a large amount of the developer penetrates into the inside of the photosensitive resin layer 34a through an interface between the roughened surface RS of the side surface of the columnar terminal 24 and the photosensitive resin layer 34a.

Thereby, recess portions CP are formed in portions, around the columnar terminals 24, of the photosensitive resin layer 34a. The recess portions CP of the photosensitive resin layer 34a serve as a dam that stems and prevents solder from flowing to the outside.

The inventors confirmed that where the upper and side surfaces of the columnar terminal were smooth surfaces, no recess portions were formed because the dissolving rate of the photosensitive resin layer around the columnar terminal was equal to that in any other parts.

After that, as shown in FIGS. 11A and 11B, heating treatment in a nitrogen atmosphere at a temperature of 200° C. is applied to the photosensitive resin layer 34a to thereby cure the photosensitive resin layer 34a.

Thus, the protection insulating layer 34 in which the recess portions CP are disposed around the columnar terminals 24 whose upper surfaces are exposed is formed between the columnar terminals 24. The recess portions CP of the protection insulating layer 34 are formed to expose a part of the side surfaces of the columnar terminals 24. Also, the recess portions CP of the protection insulating layer 34 are defined by upper portions of the side surfaces of the columnar terminals 24 and a recessed surface of the protection insulating layer 34.

The recess portions CP of the protection insulating layer 34 are, for example, in a range of about 1 µm to about 3 µm in depth from the uppermost surface of the photosensitive insulating layer 34. Also, the recess portions CP of the protection insulating layer 34 are, for example, in a range of about 2 µm to about 5 µm in width.

Since the upper and side surfaces of each columnar terminal 24 are formed into the roughened surfaces RS, the protection insulating layer 34 is formed with good adhesion to the side surface of the columnar terminal 24 because of the anchor effect.

Figure 12A:
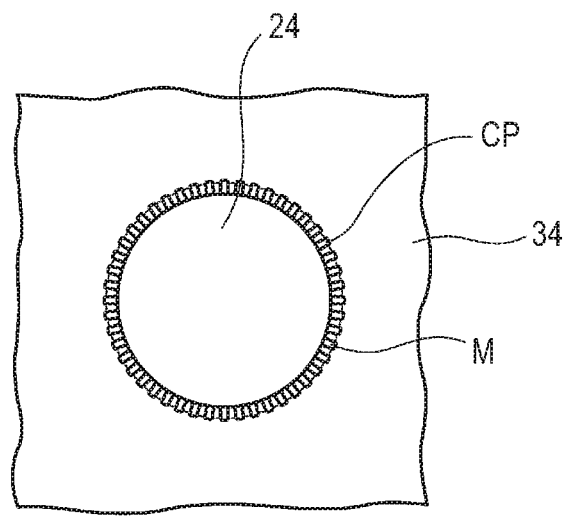
FIGS. 12A to 12C are views showing the method for manufacturing the wiring board according to the exemplary embodiment.

Referring to FIG. 12A, each recess portion CP of the protection insulating layer 34 is formed into a continuous annular shape along and around the outer circumference of the corresponding columnar terminal 24 in a plan view. Also, as shown in a partially enlarged perspective view of FIG. 12C, plural stripe protrusion portions M are formed on an inner surface of each recess portion CP of the protection insulating layer 34. The stripe protrusion portions M extend in a width direction of each recess portion CP. The stripe protrusion portions M are arranged so that the stripe protrusion portions M and a lowermost bottom surface BS of each recess portion CP form a wave-like shape. The stripe protrusion portions M protrude upward from the lowermost bottom surface BS of each recess portion CP so that the bottom surface BS is divided into regions that are located between the stripe protrusion portions M.

In this manner, irregularities Cx are formed on the bottom surface Bs side of the recess portion CP of the protection insulating layer 34, Thus, when solder flows into the recess portions CP and is stemmed by the recess portions CP, the solder is provided on the protection insulating layer 34 in the recess portion CP with good adhesion to the protection insulating layer 34 due to an anchor effect.

Figure 7B:
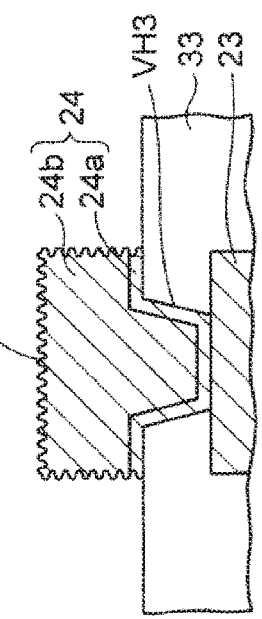

According to results of experiments conducted by the inventors, it was confirmed that a large number of fine stripe grooves like cracks were formed in a surface layer of the roughened surface RS of the metal plating layer 24b of the columnar terminal 24 which has been described with reference to FIG. 7B.

Figure 12B:
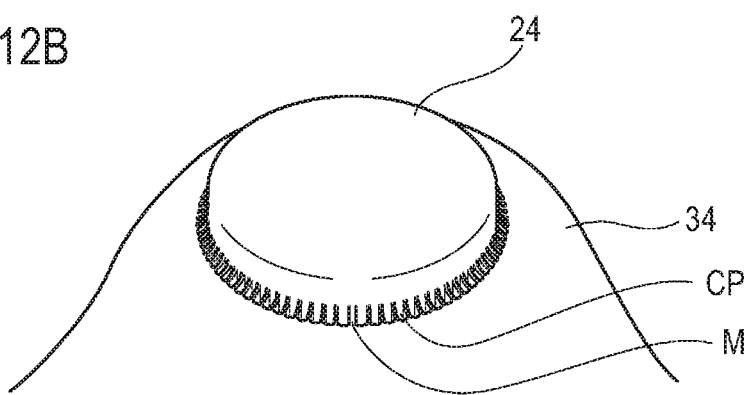
Figure 12C:
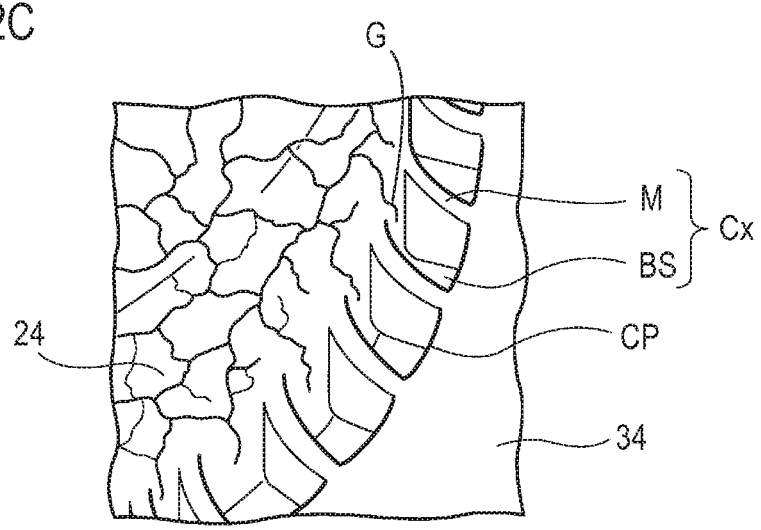

FIG. 12C shows that stripe grooves G are formed in the side surface of the columnar terminal 24. It is estimated that the stripe protrusion portions M in the recess portion CP of the protection insulating layer 34 in FIG. 12C are formed based on the fact that a lot of developer is supplied to the stripe grooves G in the surface layer of the metal plating layer 24b.

FIG. 12B is a perspective view schematically showing the entire recess portion CP of the protection insulating layer 34 of FIGS. 12A and 12B. Referring to FIG. 12B as well as FIG. 12C, the large number of stripe protrusion portions M and the stripe grooves G are disposed in the recessed surface of the protection insulating layer 34 in the recess portion CP. Thus, the stripe irregularities Cx are formed.

In the above described example, the positive-type photosensitive resin layer 34a was used as the insulating layer 34, which covers the columnar terminals 24. However, a negative-type photosensitive resin layer may be used. In this case, when the entire surface of the negative-type photosensitive insulating layer is exposed to light on the contrary to the positive-type photosensitive insulating layer, the dissolving rate by the developer becomes significantly low Thus, the removal amount can be controlled in the same manner.

Alternatively, a non-photosensitive resin layer may be used as the insulating layer covering the columnar terminals 24 and removed with an optimal wet etchant.

Even when various kinds of insulating layers are used, recess portions can be formed in the insulating layers around the columnar terminals 24 due to the effect of the roughened surfaces RS of the columnar terminals 24.

Next, as shown in FIGS. 13A and 13B, the upper surfaces of the columnar terminals 24 and the upper surface of the protection insulating layer 34 are treated by isotropic oxygen ($O_2$) plasma.

The oxygen plasma treatment removes an organic residue of the protection insulating layer 34 remaining in the recessed portions of the roughened upper surfaces RS of the columnar terminals 24, Furthermore, the oxygen plasma treatment removes an organic residue of the protection insulating layer 34 remaining in the recessed portions of the roughened side surfaces RS of the columnar terminals 24 in the recess portions CP of the protection insulating layer 34.

Also, the oxygen plasma treatment improves the solder wettability on the upper surfaces of the columnar terminals 24. Simultaneously, the solder wettability on the upper surface of the protection insulating layer 34 is also improved. However, the solder is stemmed by the recess portions CP of the protection insulating layer 34 so that the solder is prevented from flowing out onto the upper surface of the protection insulating layer 34.

Due to the oxygen plasma treatment, the surface roughness (Ra) of the upper surface of the protection insulating layer 34 is in a range of 10 nm to 30 nm. The surface roughness (Ra) of the upper surface of the protection insulating layer 34 before the oxygen plasma treatment is performed is in a range of 2 nm to 5 nm.

In this manner, when the oxygen plasma treatment is performed, the roughened surfaces RS of the columnar terminals 24 are exposed in a clean state. Thus, an area where the solder contacts with the columnar terminal 24 can be increased so that the connection strength of the solder can be improved.

In the aforementioned manner, as shown in FIG. 14A, a wiring board 1 according to the exemplary embodiment is manufactured. FIG. 14A shows the entire wiring board 1, As shown in FIG. 14A, the wiring board 1 according to the exemplary embodiment is provided with the wiring member 1a which has been described with reference to FIG. 3. The third insulating layer 33 is formed on the second insulating layer 32 of the wiring member 1a. The third insulating layer 33 is formed with the second via holes VH2 on the connection portions of the second wiring layer 22.

The electronic component mounting region A, the external connection region B and the alignment region C are defined in the wiring board 1. The columnar terminals 24 are formed on the third insulating layer 33 in the electronic component mounting region A. The columnar terminals 24 are connected to the second wiring layer 22 through the via conductors provided in the second via holes VH2.

Also, the external connection terminals 24x are formed on the third insulating layer 33 in the external connection region B. The external connection terminals 24x are connected to the second wiring layer 22 through the via conductors provided in the second via holes VH2.

Furthermore, the donut-shape alignment marks AM are formed on the third insulating layer 33 in the alignment region C.

Also, the protection insulating layer 34 is formed in regions between the columnar terminals 24 and in regions lateral to the external connection terminals 24x and the alignment marks AM. A height of the upper surface of the protection insulating layer 34 is lower than that of the upper surfaces of the columnar terminals 24. Also, the upper surface of the protection insulating layer 34 is formed to be a concave curved surface CS in the region between the columnar terminals 24 and the like.

The upper surfaces of the columnar terminals 24, the external connection terminals 24x and the alignment marks AM are exposed from the protection insulating layer 34.

As shown in the partially enlarged sectional view of FIG. 14B, the upper and side surfaces of the columnar terminal 24 are formed to be the roughened surfaces RS. In the same manner, the upper and side surfaces of the external connection terminals 24x and the alignment marks AM are also formed to be roughened surfaces RS.

Furthermore, the annular recess portions CP are formed in the portions of the protection insulating layer 34 around the columnar terminals 24. The recess portions CP of the protection insulating layer 34 are formed to expose the portions of the side surfaces of the columnar terminals 24. In the same manner, annular recess portions CP are also formed in portions of the protection insulating layer 34 around the external connection terminals 24x and the alignment marks AM.

As described in the manufacturing method, the rising and falling upper surface of the photosensitive resin layer 34 is removed to the intermediate position in the thickness direction thereof in the wiring substrate 1 according to the exemplary embodiment. Therefore, the whole upper surfaces of the columnar terminals 24 are exposed in a self-alignment manner.

As a result, an alignment process is not required. Thus, the fine columnar terminals 24 having about 40 μm in arrangement pitch can be employed to support mounting with a high performance semiconductor chip.

Also, for the above-described reason, the upper surface of the protection insulating layer 34 is formed to be the symmetrical concave curved surface CP in sectional view in the regions between the columnar terminals 24.

Next, description will be given on a method for mounting an electronic component on the wiring board 1 to obtain an electronic component device.

Figure 15:
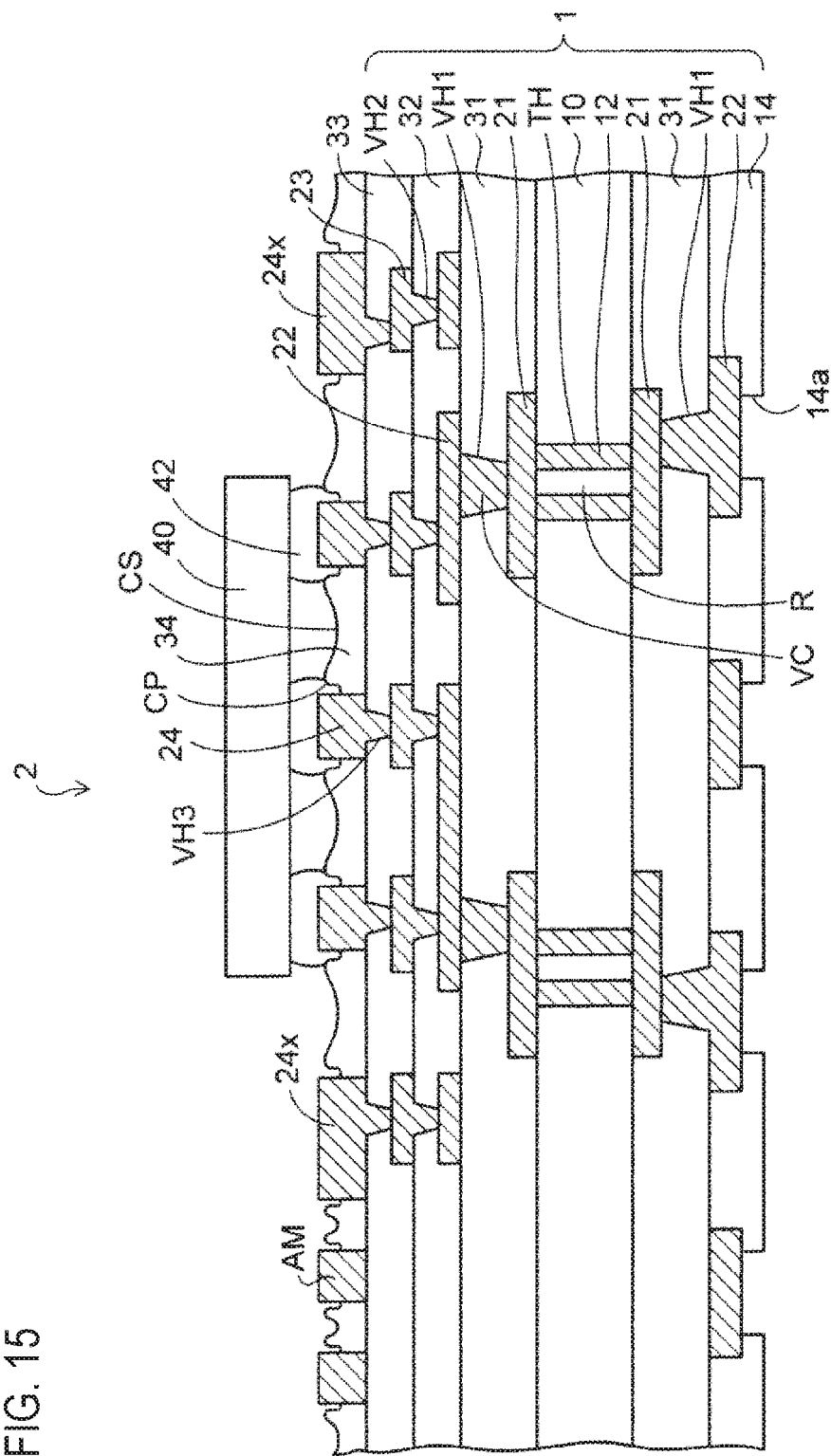
FIG. 15 is a sectional view showing an electronic component device according to the exemplary embodiment.

First, as shown in FIG. 15, a first semiconductor chip 40 is prepared as an electronic component. The first semiconductor chip 40 is provided with solder bumps 42 on a lower surface side thereof. For example, a CPU chip is used as the first semiconductor chip 40, Then, the solder bumps 42 of the first semiconductor chip 40 are aligned with and disposed on the columnar terminals 24 of the wiring board 1 by a component mounter based on image recognition of the alignment marks AM. The arrangement pitch between the columnar terminals 24 in the wiring board 1 corresponds to an arrangement pitch between the solder bumps 42 in the semiconductor chip 40. For example, tin (Sn)-silver (Ag) based lead-free solder is used for the solder bumps 42.

Furthermore, the solder bumps 42 are reflow-heated and melted at a temperature of about 260° C. Thereby, the solder bumps 42 of the first semiconductor chip 40 are connected to the columnar terminals 24 of the wiring board 1 in a flip-chip manner.

Figure 16:
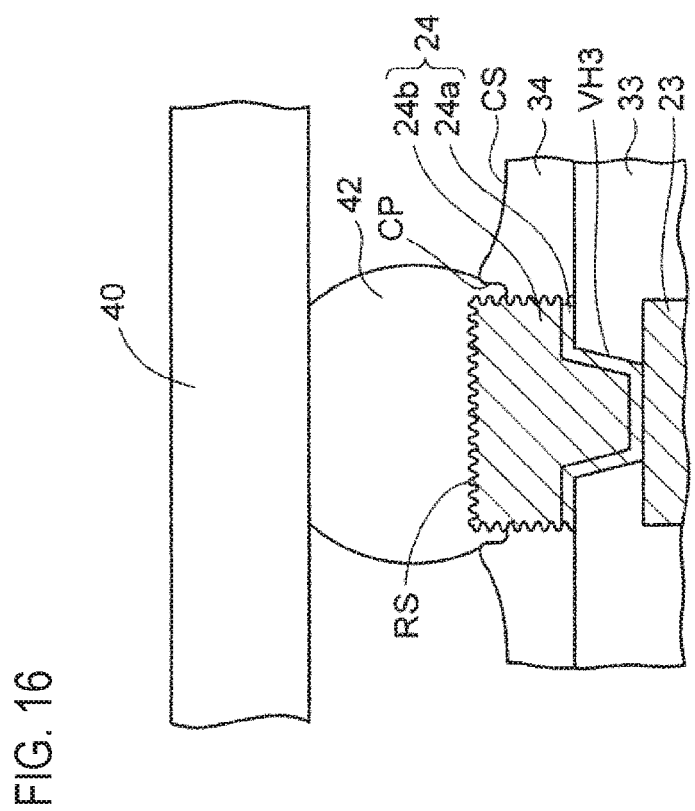
FIG. 16 is a partially enlarged sectional view of a region including a columnar terminal of the wiring board shown in FIG. 15.

FIG. 16 is a partially enlarged sectional view of a region including a columnar terminal 24 of the wiring board 1 in FIG. 15. Referring to FIG. 16, when the solder bumps 42 of the first semiconductor chip 40 are melted, the recess portions CP of the protection insulating layer 34 around the columnar terminals 24 serve as dams which stem the solder.

In this manner, the solder bumps 42 are stemmed by the recess portions CP of the protective insulating resin 34. Therefore, the solder can be prevented from flowing out to regions outside the recess portions CP of the protection insulating layer 34. Thus, even when the solder bumps 42 of the first semiconductor chip 40 are arranged at a narrow pitch, electric short-circuit between the solder bumps 42 can be prevented.

Also, the upper surfaces of the columnar terminals 24 of the wiring board 1, which serve as connection portions, are formed to be the roughened surfaces RS, and $O_2$ plasma treatment is performed thereon. Thereby, the solder wettability is improved. Thus, the solder bumps 42 of the first semiconductor chip 40 are connected onto the columnar terminals 24 with good adhesion.

Furthermore, $O_2$ plasma treatment is also performed for the upper surface of the protection insulating layer 34 including the recess portions CP so as to improve the solder wettability, Thus, the solder bumps 42 of the first semiconductor chip 40 are also formed on the recess portions CP of the protection insulating layer 34 with good adhesion.

In this manner, according to the exemplary embodiment, adhesion can be enhanced as compared with the structure in which adhesion strength is secured only between the columnar terminal 24 and the solder bump 42 of the first semiconductor chip 40. Thus, reliability can be further improved.

Also, while the solder wettability of the protection insulating layer 34 is improved, the recess portions CP are formed as dams for preventing the solder from flowing out. It is, therefore, possible to manufacture a structure having both the function of improving the adhesion to the solder and the function of preventing the solder from flowing out.

In the above described manner, it is possible to manufacture and obtain an electronic component device 2 according to the exemplary embodiment in which the semiconductor chip 40 is connected onto the wiring board 1 in a flip-chip manner. Underfill resin may be charged between the semiconductor chip 40 and the wiring board 1.

Figure 17:
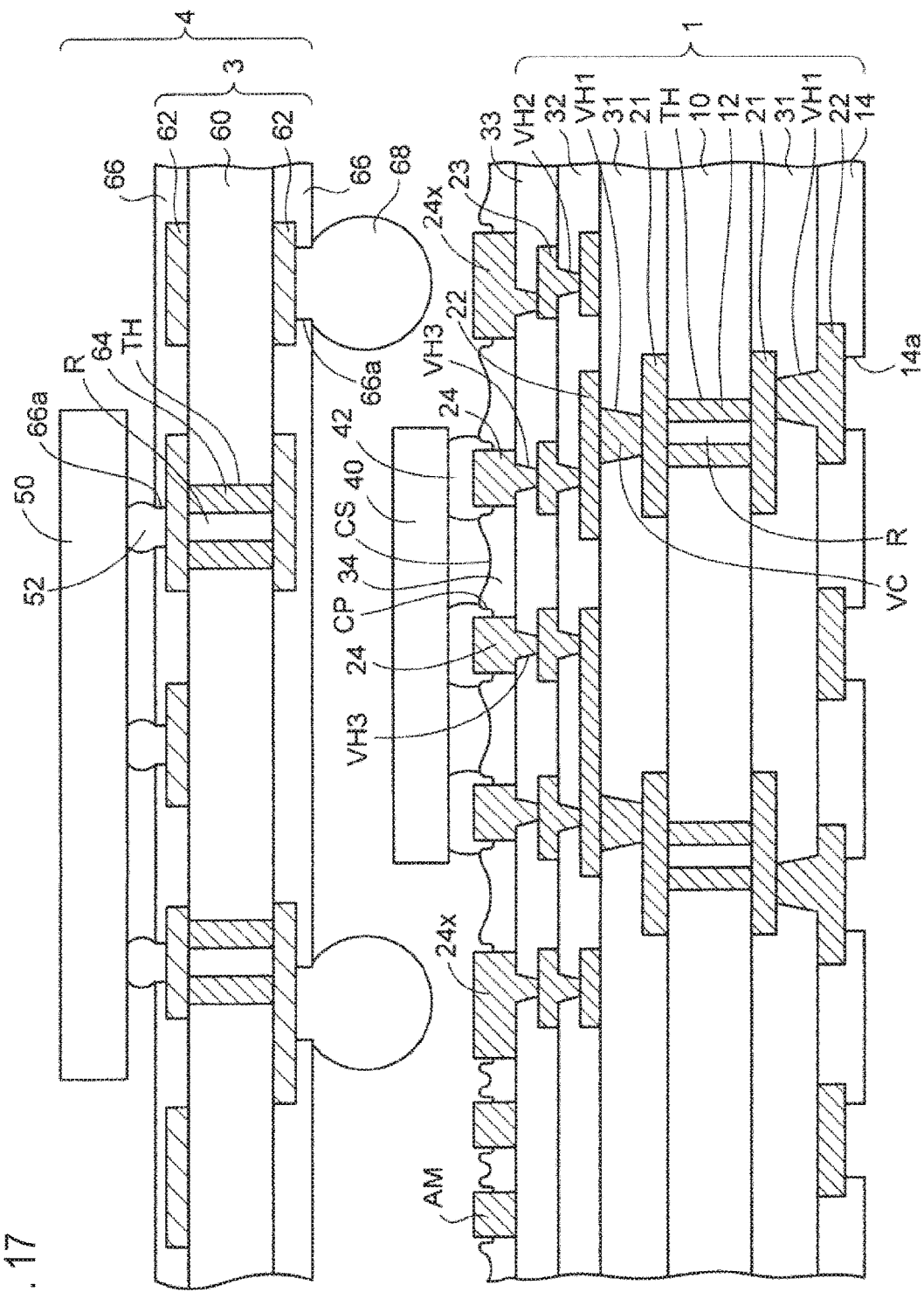
FIG. 17 is a sectional view showing a state in which an upper electronic component device is stacked on the electronic component device shown in FIG. 15.

Next, as shown in FIG. 17, an upper electronic component device 4 is prepared. The upper electronic component device 4 is provided with an upper wiring board 3 and a second semiconductor chip 50. In the upper wiring board 3, wiring layers 62 are formed on both surface sides of a substrate 60, respectively. The wiring layers 62 on the both surface sides are connected to each other through a through hole plating layer 64 provided on side surfaces of through holes TH formed in the substrate 60. The remaining hole part of the through hole TH is filled with a resin body R.

Solder resist layers 66 are formed on the both surface sides of the substrate 60, respectively. The solder resist layers 66 are formed with opening portions 66a on connection portions of the wiring layers 62.

Also, bump electrodes 52 of the second semiconductor chip 50 are connected to the wiring layers 62 of the upper wiring board 3 in a flip-chip manner. The second semiconductor chip 50 is, for example, a memory chip. Furthermore, solder bumps 68 are formed on the wiring layer 62 on the lower surface side of the upper wiring board 3. Underfill resin may be charged between the second semiconductor chip 50 and the upper wiring board 3.

Figure 18:
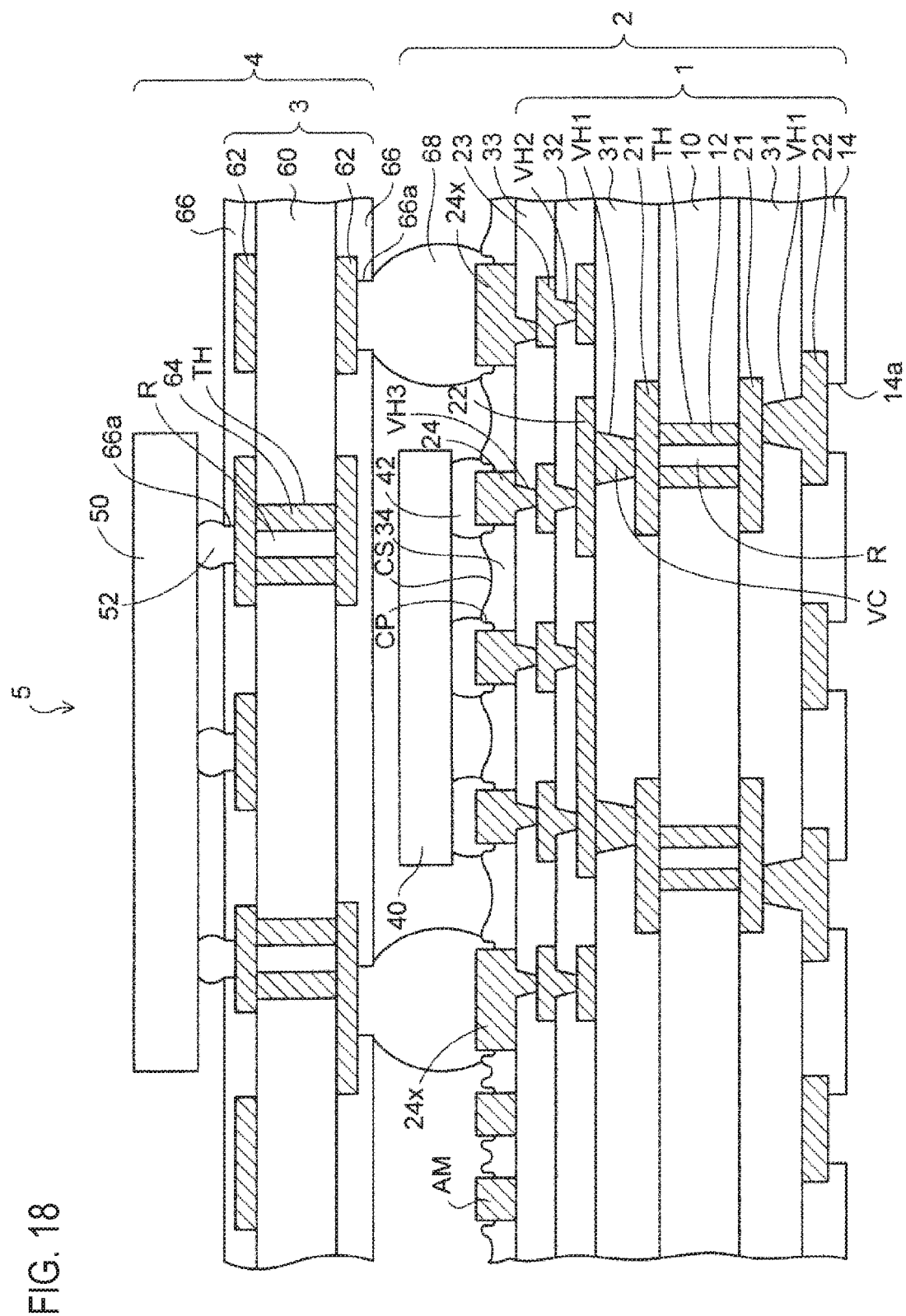
FIG. 18 is a sectional view showing a stack type electronic component device according to the exemplary embodiment.

Referring to FIG. 18, the solder bumps 68 of the upper electronic component device 4 are aligned with and arranged on the external connection terminals 24x of the wiring board 1 by a component mounter based on image recognition of the alignment marks AM.

Furthermore, the solder bumps 68 of the upper electronic component device 4 are connected to the external connection terminals 24x of the wiring board 1 by reflow-heating. Thereby, the first semiconductor chip is housed in a region under the upper electronic component device 4.

On this occasion, the solder bumps 68 of the upper electronic component device 4 can be connected to the external connection terminals 24x of the wiring board 1 with good adhesion and with high reliability, similarly to the step shown in FIG. 15. This is because a structure in and around the external connection terminals 24x of the wiring substrate 1 is the same as that in and around the columnar terminals 24, as shown in FIG. 18.

In the above described manner, as shown in FIG. 18, it is possible to obtain a stack type electronic component device 5 according to the exemplary embodiment. In the electronic component device 5, the upper electronic component device 4 is stacked on the electronic component device 2 through the solder bumps 68.

The stack type electronic component device 5 in FIG. 18 is a suitable example. Various kinds of electronic component devices may he constructed using the wiring board 1 according to the exemplary embodiment shown in FIG. 14A.

For example, plural CPU chips may be arranged laterally on the wiring board 1 and connected in a flip-Chip manner, and a memory module or a CSP may he stacked on the wiring board 1 through solder bumps so as to house the CPU chips. Alternatively, passive elements such as chip capacitors may be mounted laterally to the semiconductor chips on the wiring board 1.

[Clauses]

This disclosure further encompasses various exemplary embodiments, for example, described below.

1. A method for manufacturing a wiring board, the method comprising:

forming upper and side surfaces of plural terminals of a wiring member to be roughened surfaces;

forming an insulating layer on the wiring member so that the insulating layer covers the terminals and an upper surface of the insulating layer rise and fall in accordance with steps defined by the terminals; and removing the insulating layer up to an intermediate position in a thickness direction of the insulating layer from the upper surface thereof so that the insulating layer whose upper surface is formed to be a concave curved surface is left between the terminals with the upper surfaces of the terminals being exposed, while recess portions are formed in the insulating layer around the terminals to partially expose the side surfaces of the terminals.

2. The method of the clause 1, wherein in the forming the insulating aver, the insulating layer is a positive-type photosensitive resin layer, and the removing the insulating layer up to the intermediation position in the thickness direction from the upper surface thereof comprises dissolving the unexposed positive-type photosensitive resin layer with a developer.

3. The method of any one of the clauses 1 and 2, wherein plural stripe protrusion portions are formed on an inner surface of each recess portion, the stripe protrusion portions extend in a width direction of the recess portion, and the stripe protrusions are disposed side by side.

4. A method for manufacturing an electronic component device, the method comprising:

manufacturing a wiring board by a method comprising
forming upper and side surfaces of plural terminals of a wiring member to be roughened surfaces, forming an insulating layer on the wiring member so that the insulating layer covers the terminals and an upper surface of the insulating layer rise and fall in accordance with steps defined by the terminals, and removing the insulating layer up to an intermediate position in a thickness direction of the insulating layer from the upper surface thereof so that the insulating layer whose upper surface is formed to be a concave curved surface is left between the terminals with the upper surfaces of the terminals being exposed, while recess portions is formed in the insulating layer around the terminals to partially expose the side surfaces of the terminals; and connecting an electronic component to the terminals of the wiring board through solder.

What is claimed is:

1. A wiring board comprising:

plural terminals each including a roughened upper surface and a roughened side surface;

an insulating layer that is formed between the terminals, the upper surfaces of the terminals being exposed, an upper surface of the insulating layer being a concave curved surface, and recess portions that are formed in the insulating layer around the terminals so as to partially expose the side surfaces of the terminals.

2. The wiring board according to claim 1, wherein plural stripe protrusion portions are formed on an inner surface of each recess portion, the stripe protrusion portions extend in a width direction of the recess portion, and the stripe protrusions are disposed side by side.

3. The wiring board according to claim 1, wherein each recess portion is defined by the side surfaces of the terminals and a recessed surface of the insulating layer.

4. The wiring board according to claim 1, wherein a surface roughness of the roughened upper and side surfaces of the terminals is in a range of 0.2 μm to 1.0 μm.

5. The wiring board according to claim 1, wherein each recess portion has an annular shape when viewed from above.

6. The wiring board according to claim 1, wherein the insulating layer is made of a photosensitive resin.

7. The wiring board according to claim 6, wherein the photosensitive resin of the insulating layer is of a positive type.

8. The wiring board according to claim 1, wherein a surface roughness of the upper surface of the insulating layer is in a range of 10 nm to 30 nm.

9. An electronic component device comprising:

a wiring board; and an electronic component, wherein the wiring board comprises plural terminals each including a roughened upper surface and a roughened side surface, an insulating layer that is formed between the terminals, the upper surfaces of the terminals being exposed, an upper surface of the insulating layer being a concave curved surface, and recess portions that are formed in the insulating layer around the terminals so as to partially expose the side surfaces of the terminals, and the electronic component is connected to the terminals of the wiring board through solder disposed in the recess portions and on the upper surfaces of the terminals of the wiring board.

* * * * *